(12) United States Patent
Sinop et al.

(10) Patent No.: US 8,055,037 B2
(45) Date of Patent: Nov. 8, 2011

(54) ROBUST RECONSTRUCTION METHOD FOR PARALLEL MAGNETIC RESONANCE IMAGES

(75) Inventors: Ali Kemal Sinop, Pittsburgh, PA (US); Leo Grady, Yardley, PA (US)

(73) Assignee: Siemens Aktiengesellschaft, München (DE)

( * ) Notice: Subject to any disclaimer, the term of this patent is extended or adjusted under 35 U.S.C. 154(b) by 1021 days.

(21) Appl. No.: 11/928,121

(22) Filed: Oct. 30, 2007

(65) Prior Publication Data
US 2009/0010515 A1 Jan. 8, 2009

Related U.S. Application Data

(60) Provisional application No. 60/947,522, filed on Jul. 2, 2007.

(51) Int. Cl.
*G06K 9/00* (2006.01)
(52) U.S. Cl. .......................................... 382/128; 378/4
(58) Field of Classification Search .................. 382/100, 382/128, 129, 130, 131, 132; 128/128; 378/4–27
See application file for complete search history.

(56) References Cited

U.S. PATENT DOCUMENTS

| | | | | |
|---|---|---|---|---|
| 5,414,782 A * | 5/1995 | Carasso | ....................... | 382/270 |
| 6,018,600 A * | 1/2000 | Levin et al. | .................... | 382/284 |
| 7,187,810 B2 * | 3/2007 | Clune et al. | .................... | 382/294 |
| 2004/0252870 A1 * | 12/2004 | Reeves et al. | ................. | 382/128 |
| 2007/0092121 A1 * | 4/2007 | Periaswamy et al. | ......... | 382/128 |

OTHER PUBLICATIONS

L. Grady. Random walks for image segmentation. IEEE Transactions on Pattern Analysis and Machine Intelligence, 28(11): 1768-1783, Nov. 2006.
K. P. Pruessmann, M. Weiger, M. B. Scheidegger and B. Peter. SENSE: Sensitivity encoding for fast MRI. Magnetic Resonance in Medicine, 42(5): 952-962, 2001.
A. Raj, G. Singh, and R. Zabih. MRF's for MRI's: Bayesian reconstruction of MR images via graph cuts. In Proc. of 2006 IEEE Computer Society Conf. on Computer Vision and Pattern Recognition (CVPRO6), vol. 1, pp. 1061-1068. IEEE Computer Society, 2006.

* cited by examiner

*Primary Examiner* — Anand Bhatnagar
(74) *Attorney, Agent, or Firm* — Donald B. Paschburg

(57) ABSTRACT

Methods and systems for reconstruction of an image from parallel Magnetic Resonance Image (pMRI) data are disclosed. A reconstructed pMRI image may suffer from noise and aliasing. A method for reducing aliasing by applying a bounded error function is disclosed. A method for reducing noise in a reconstruction by applying an error term is also disclosed. Error terms are included in an expression that can be solved as a minimization problem. Creating a solution in an iterative way is also disclosed. Examples of specific solutions are provided. A system applying the methods is also provided.

22 Claims, 3 Drawing Sheets

ROBUST RECONSTRUCTION METHOD FOR PARALLEL MAGNETIC RESONANCE IMAGES

CROSS-REFERENCE TO RELATED APPLICATIONS

This application claims the benefit of U.S. Provisional Application No. 60/947,522 filed Jul. 2, 2007, which is incorporated herein by reference.

BACKGROUND OF THE INVENTION

The present invention relates to Magnetic Resonance Imaging (MRI). More iIn particular, it relates to parallel Magnetic Resonance Imaging (pMRI) as applied for instance, in medical imaging.

Parallel Magnetic Resonance Imaging is a new technology revolutionizing traditional MRI. However reconstruction for parallel MRI is a very challenging task and there are some common problems with existing methods. Current embodiments of parallel MRI make a trade-off between image acquisition time and image quality leading to images that suffer from aliasing and noise.

Accordingly, novel and improved methods and systems are required for parallel Magnetic Resonance Imaging that produce images with less aliasing and noise.

SUMMARY OF THE INVENTION

One aspect of the present invention presents novel methods and system that will provide improved reconstructed images in parallel Magnetic Resonance Imaging (pMRI).

In accordance with another aspect of the present invention a method for parallel Magnetic Resonance Image (pMRI) reconstruction from image data is provided, comprising processing acquired lines in k-space for reconstruction of an image from the image data; and optimizing a quality measure of the reconstruction of the image by filling in missing lines by applying a bounded penalty.

In accordance with a further aspect of the present invention, the bounded penalty is determined by an error function $$\sigma^{\alpha}(x) = \sum_i (1 - e^{-\alpha x_i^2}).$$

In accordance with another aspect of the present invention, the method is provided further comprising using a discontinuity preserving spatial coherency function for reducing noise.

In accordance with a further aspect of the present invention, the discontinuity preserving spatial coherency function is expressed as $f(x) = \lambda \sigma^{\alpha_2}(Ax)$.

In accordance with another aspect of the present invention, an error data term due to aliasing is expressed as $$f(x) = \sum_{i=1}^{N} \sigma^{\alpha_1}(Ky_i - KFS_i x)$$

with $$\sigma^{\alpha}(x) = \sum_i (1 - e^{-\alpha x_i^2}).$$

In accordance with a further aspect of the present invention, the method further comprises solving $$\min_x f(x) = \min_x \sum_i \sigma^{\alpha_1}(Ky_i - KFS_i x) + \lambda \sigma^{\alpha_2}(Ax).$$

In accordance with another aspect of the present invention, the bounded penalty is applied iteratively.

In accordance with a further aspect of the present invention, the method further comprises solving in an iterative way an equation $$\left(\sum_i S_i^T F^T KC_{1,i} FS_i + \lambda A^T C_2 A\right) x_1 = \left(\sum_i S_i^T F^T KC_{1,i} y_i\right),$$

including the steps of estimating a value of $C_{1,i}$ and $C_2$, solving the equation for $x_t$ and stopping solving when $\|x_t - x_{t-1}\| \geq \epsilon$ or when a maximum number of iterations has been reached.

In accordance with another aspect of the present invention $\alpha_1 = 20{,}000$, $\alpha_2 = 800$, $\lambda = 0.0025$ and $\epsilon = 1e-7$.

In accordance with a further aspect of the present invention, a method is provided for parallel Magnetic Resonance Image (pMRI) reconstruction from image data, comprising processing acquired lines in k-space for reconstruction of an image from the image data; and adjusting acquired lines in k-space to meet a quality measure of the reconstruction of the image by applying a bounded penalty.

In accordance with another aspect of the present invention, the quality measure is expressed as an error function $$f(x) = \sum_{i=1}^{N} \sigma^{\alpha_1}(Ky_i - KFS_i x)$$

with $$\sigma^{\alpha}(x) = \sum_i (1 - e^{-\alpha x_i^2}).$$

In accordance with a further aspect of the present invention, the method further comprises using a discontinuity preserving spatial coherency function for reducing noise.

In accordance with another aspect of the present invention, the discontinuity preserving spatial coherency function is expressed as: $f(x) = \lambda \sigma^{\alpha_2}(Ax)$ with $$\sigma^{\alpha}(x) = \sum_i (1 - e^{-\alpha x_i^2}).$$

In accordance with a further aspect of the present invention, the method further comprises solving $$\min_x f(x) = \min_x \sum_i \sigma^{\alpha_1}(Ky_i - KFS_i x) + \lambda \sigma^{\alpha_2}(Ax).$$

In accordance with another aspect of the present invention, the bounded penalty is applied iteratively.

In accordance with a further aspect of the present invention, a system for parallel Magnetic Resonance Image (pMRI) reconstruction from image data is provided, that is able to perform all the steps of the methods provided herein as aspects of the present invention.

DESCRIPTION OF A PREFERRED EMBODIMENT

Figure 1:
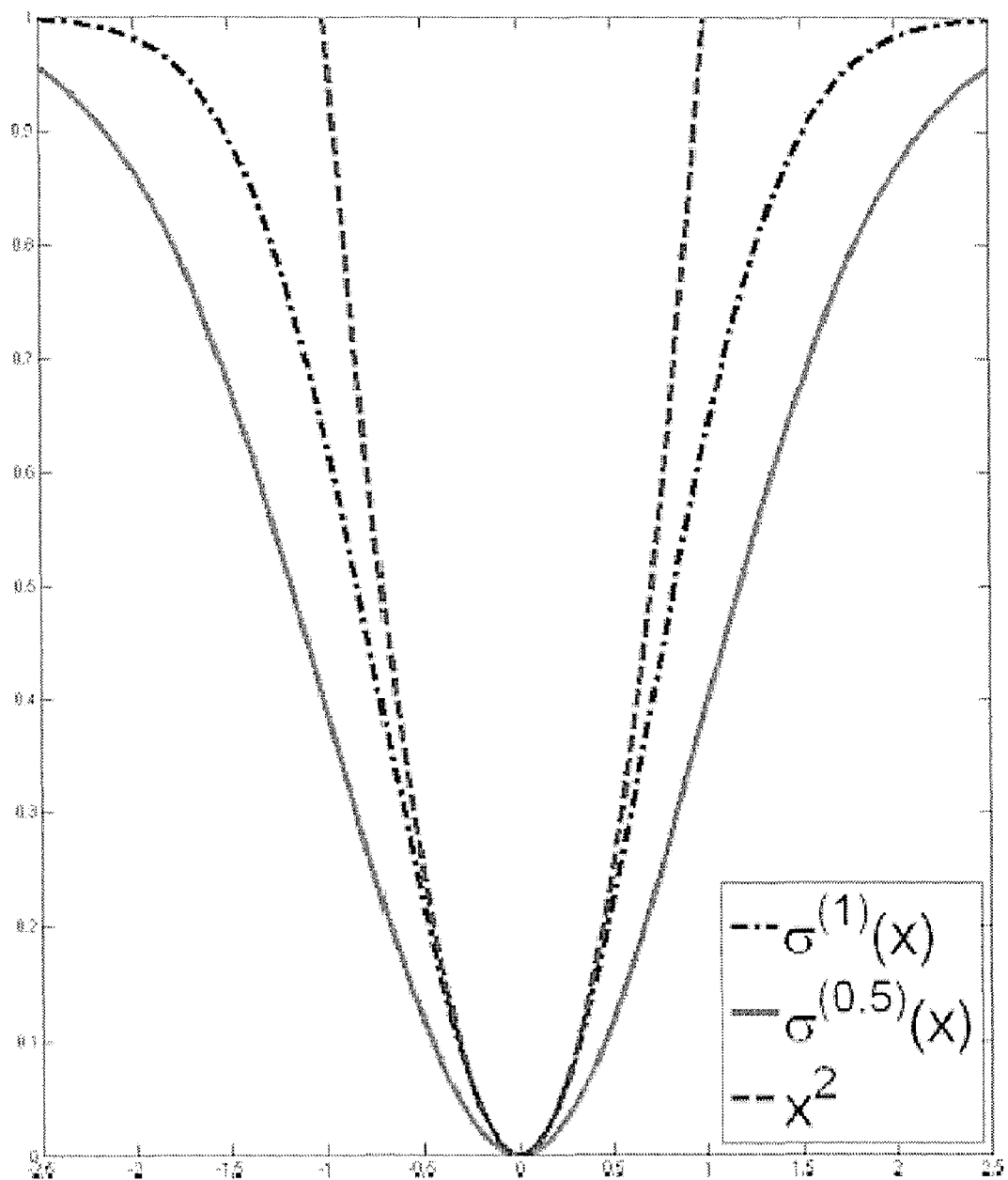
FIG. 1 illustrates robust error function in accordance with one aspect of the present invention.

Magnetic resonance (MR) is an important imaging technique due to its flexibility and safety. However, there is a fundamental tradeoff in MR between acquisition time and image quality. In many circumstances, it is desirable to decrease the acquisition time so as to reduce the artifacts resulting from the mobility of patient as well as breathing or heart beating. In typical MR, an image is acquired in k-space. This acquisition is performed serially where each row in k-space is acquired at a time.

A recent advancement for accelerating MR scans is called parallel imaging. In parallel imaging, there are multiple receiver coils. These coils only acquire a specific subset of the rows (e.g. odd or even lines). This technique results in a significant decrease in the acquisition time. There are two related problems associated with parallel imaging. These two problems are: how to estimate the unknown frequency components and how to combine the images from different coils?. As an aspect of the present invention, a unified procedure is provided for simultaneously doing both estimating the unknown frequency components and combining the images from different coils that strongly suppresses noise and aliasing while preserving structure.

As an introduction, notations and formulations for parallel imaging will be provided. Let x be the reconstructed image. Let $y_i$ be the known components from coil i (all other components are zero) with N coils, similarly let $z_i$ be the frequency components for coil i in the reconstructed image. Let K be a diagonal matrix filled with 1's corresponding to known frequencies and 0's elsewhere. Therefore $y_i=Ky_i$. Similarly, let $S_i$ be the sensitivity map for coil i. Lastly, let F be the discrete Fourier transformation matrix. One can write $y_i$ in term of x as follows:

$$y_i = KFS_i x. \qquad (1)$$

In order to find x, a suitable approach is to minimize the sum of squares:

$$\min_x \sum_{i=1}^N \|y_i - KFS_i x\|^2. \qquad (2)$$

Since there is still the chance of this system being rank deficient (there might be points in x on which all $S_i$'s are nearly zero), it is necessary to introduce a regularization term. If one adds a second term $\lambda \Sigma_j x_j^2$ to (2), one gets:

$$\min_x \sum_{i=1}^N \|y_i - KFS_i x\|^2 + \lambda x^T I x, \qquad (3)$$

where I is the identity matrix. The above expression is minimized when x is the solution of the following system:

$$\left(\lambda I + \sum_i S_i^T F^T KFS_i\right) x = \sum_i S_i^T F^T K y_i. \qquad (4)$$

In order to solve the above problem, it is not necessary to explicitly invert a matrix—it is not even required to store the whole matrix. Instead, an efficient iterative solver, like conjugate gradients method as described in "G. Golub and C. Van Loan., Matrix Computations., The Johns Hopkins University Press, 3rd edition, 1996.", can be used. In the pMRI community, the above approach is known as SENSE which is described for instance in "R. Bammer and S. O. Schoenberg., Current concepts and advances in clinical parallel magnetic resonance imaging., Topics in Magnetic Resonance Imaging, 15(3):129-58, June 2004." and in "K. P. Pruessmann, M. Weiger, M. B. Scheidegger and B. Peter. SENSE: Sensitivity encoding for fast MRI. Magnetic Resonance in Medicine, 42(5): 952-962, 2001."

A second approach for this problem is called GRAPPA, as described in "M. A. Griswold, P. M. Jakob, R. M. Heidemann, N. Nittka, V. Jellus, J. M. Wang, B. Kiefer, and A. Haase., Generalized autocalibrating partially parallel acquisitions (GRAPPA). Magnetic Resonance in Medicine, 47:1202-1210, 2002"". In this case, one first computes unknown frequencies as a linear combination of the known ones. i.e., $z_i = Ay_i$. The combination matrix (fitting coefficients) A is generally learned from a united number of reference lines. These $z_i$'s are then combined to form the final image.

There are some common problems associated with both approaches. In the SENSE approach, the common method of regularization prefers darker images as a reconstruction. In the case of GRAPPA, interpolating known frequencies to find the unknown ones is difficult to interpret in the image domain. In both techniques, all acquired frequencies are treated equally, whereas in reality, some of them might be more corrupted due to noise, which can lead to aliasing. Lastly, none of these techniques enforce a notion of spatial coherency in the reconstructed image, which may result in a noisy reconstruction.

Another proposed idea for solving the parallel reconstruction problem was proposed by Raj et al. in "A. Raj, G. Singh, and R. Zabih. MRF's for MRI's: Bayesian reconstruction of MR images via graph cuts., In Proc. of 2006 IEEE Computer Society Conf. on Computer Vision and Pattern Recognition (CVPRO6), volume 1, pages 1061-1068. IEEE Computer Society, 2006.", in which they provide a SENSE-like formulation with discontinuity preserving spatial priors. However, there are three problems with this algorithm. The first problem is speed, as it generally takes a full day to reconstruct a volume. Second, this method produces images with discrete intensities (0-255) which causes banding artifacts. Lastly, this algorithm still suffers from aliasing, albeit offering an improvement over SENSE.

As aspects of the present invention, two new ideas for parallel imaging reconstruction are provided that are intended to address the above problems:

1. Reduce noise (while keeping structure) by employing discontinuity preserving spatial coherency.

2. Reduce aliasing by allowing the acquired lines to k-space to adjust in an energy minimization framework.

Although the noise term could be introduced independently (without significantly altering the speed of reconstruction over GRAPPA or SENSE), the approach for reducing aliasing requires a regularization of a form similar to the introduced noise term.

Methods

Next the solutions for addressing problems with aliasing and noise will be provided. Then, each solution will be combined and an algorithm will be provided to perform the reconstruction.

Reducing Aliasing

The biggest challenge with parallel MR reconstruction is the presence of aliasing in the image. In the acquisition stage, certain lines in k-space for each coil are unacquired, resulting in the image being folded onto itself. If there were no noise in the acquisition (and the sensitivity maps spanned the space), then by just solving equation (2) one can recover the true reconstruction.

As an aspect of the present invention, a method is provided to adjust for possible noise in the acquisition by allowing the acquired lines in k-space to vary, but penalizing outliers in the acquisition with a bounded penalty. Specifically, instead of the sum of squares penalty in equation (2), a robust error function $\sigma$ is used with:

$$\sigma^\alpha(x) = \sum_i (1 - e^{-\alpha x_i^2}) \quad (5)$$

where 'x' is taken as any vector and the summation is performed over the vector indices. A plot of this function is shown for different values of a along with the square function in FIG. 1.

The advantage of using $\sigma$ over a squared error function is that, for outliers in the measurement, only a constant penalty is given, whereas in the squared error function, outliers are given unbounded penalty. Also, unknown frequencies are explicitly represented as $z_i$ for each channel i. Hence, a GRAPPA-like formulation is provided where each unknown frequency component is being estimated. However, unlike GRAPPA, the reconstructed image is simultaneously estimated. Consequently, the data error term is given by:

$$f(x, y) = \sum_{i=1}^{N} \sigma^{\alpha_1}(Ky_i + (I - K)z_i - FS_i x). \quad (6)$$

Equation (6) can be simplified in terms of $z_i$'s, since none of the remaining terms which will be introduced later depend on $z_i$. Notice that in the above expression, if $z_i = (I-K)FS_i x$, this would make the energy minimum for the unknown frequencies. Inserting this expression into equation (6) provides:

$$f(x) = \sum_{i=1}^{N} \sigma^{\alpha_1}(Ky_i - KFS_i x), \quad (7)$$

which is the final formulation of the approach to reducing aliasing.

Reducing Noise

A common machinery in the computer vision community for noise reduction is using an error term which enforces spatial coherency by penalizing intensity differences in the neighboring pixels, as described for instance in "L. Grady., Random walks for image segmentation., IEEE Transactions on Pattern Analysis and Machine Intelligence, 28(11): 1768-1783, November 2006." Let A be the following matrix:

$$A = (a_{ij}) = \begin{cases} +1, & \text{if pixels } i \text{ and } j \text{ are neighbors and } i < j \\ -1, & \text{if pixels } i \text{ and } j \text{ are neighbors and } i \geq j \\ 0, & \text{otherwise} \end{cases} \quad (8)$$

In graph theory, this matrix is called the node-edge incidence matrix as described in "G. Strang., Introduction to Applied Mathematics., Wellesley-Cambridge Press, 1986."" Given an image x, Ax gives the intensity differences between neighboring pixels. Therefore, a smoothness constraint can be captured by summing the squares of the pixel differences across the entire image, $\|Ax\|^2 = x^T A^T A x$.

However, employing the squared gradients as an error term would have the negative consequence of producing an overly smoothed image, since the error term would grow unbounded at object boundaries within the image. To solve this problem, again the robust error function, $\sigma$ of equation (5), will be used which will prevent an unbounded penalty on large differences in intensities. Hence the function that will be used to enforce spatial coherency while preserving boundaries is $\sigma^{\alpha_2}(Ax)$.

Accordingly, whereas in previous techniques all acquired frequencies are treated equally, but in reality some of them might be more corrupted due to noise, which can lead to aliasing, in accordance with an aspect of the present invention, a method for parallel Magnetic Resonance Image (pMRI) reconstruction from image data is provided that comprises processing acquired lines in k-space for reconstruction of an image from the image data and optimizing a quality measure of the reconstruction of the image by filling in missing lines by applying a bounded penalty.

Formulation

Combining these methods together produces the energy minimization problem $$\min_x f(x) = \min_x \sum_i \sigma^{\alpha_1}(Ky_i - KFS_i x) + \lambda \sigma^{\alpha_2}(Ax). \quad (9)$$

In this formulation, $\alpha_1$, $\alpha_2$ and $\lambda$ are user dependent parameters. The parameter $\alpha_1$ expresses the point at which an acquired line be considered as an outlier. Similarly, $\alpha_2$ expresses the gradient level at which one may consider the gradient as a discontinuity. Lastly, the $\lambda$ parameter controls denotes the strength of the smoothing term.

Taking a variation with respect to x of this expression yields $$\frac{\partial f}{\partial x} = \sum_i S_i^T F^T K \underbrace{C^{\alpha_1}(FS_i x - y_i)}_{C_{1,i}} + \lambda A \underbrace{C^{\alpha_2}(Ax)}_{C_2} Ax = 0.$$

Here $C^\alpha(x) = \alpha \mathrm{diag}(e^{-\alpha x_1^2}, \ldots, e^{-\alpha x_n^2})$. Newton's method as described in "W. H. Press, S. A Teukolsky, W. T. Vetterling, and B. P. Flannery., Numerical Recipes in C: The Art of Scientific Computing., Cambridge University Press, 2nd edition, 2002."", will be used to solve the above problem. In each iteration, first $C_{1,i}$ and $C_2$ from the previous solution (if this is the first iteration then both are taken to be the identity matrix I) will be estimated. Then using $C_{1,i}$ and $C_2$, the above system will be solved with C's being fixed.

Pseudo-code for this procedure is given below:

1. $C_{1,i} \leftarrow \alpha_1 I, \forall i$
2. $C_2 \leftarrow \alpha_2 I$
3. $t \leftarrow 1$
4. $x_0 \leftarrow 0$
5. Repeat
   (a) Solve
   $$\left(\sum_i S_i^T F^T K C_{1,i} F S_i + \lambda A^T C_2 A\right) x_t = \left(\sum_i S_i^T F^T K C_1 y_i\right)$$
   for $x_t$,
   (b) $C_{1,i} \leftarrow C^{\alpha 1}(FS_i x_t - y_i)$
   (c) $C_2 \leftarrow C^{\alpha 2}(Ax_t)$
   (d) $t \leftarrow t + 1$ 6. Until $\|x_t - x_{t-1}\| \geqq \epsilon$ or maximum number of iterations reached.
7. Output $x_t$.

This algorithm will output the reconstructed image $x_t$. Note that in step 5a, it is not necessary to explicitly store either the matrix or its inverse. As mentioned before, one can use an iterative linear system solver like conjugate gradients as described in "G. Golub and C. Van Loan., Matrix Computations., The Johns Hopkins University Press, 3rd edition, 1996.", which requires only a matrix-vector multiplication procedure. For such a scheme, in the computation of $(\Sigma_i S_i^T F^T K C_{1,i} F S_i + \lambda A^T C_2 A)x$ the most expensive part is multiplying with the discrete Fourier transformation matrix, F. However one can employ a Fast Fourier Transform (and inverse Fast Fourier Transform) to do this multiplication efficiently.

Results

Figure 2:
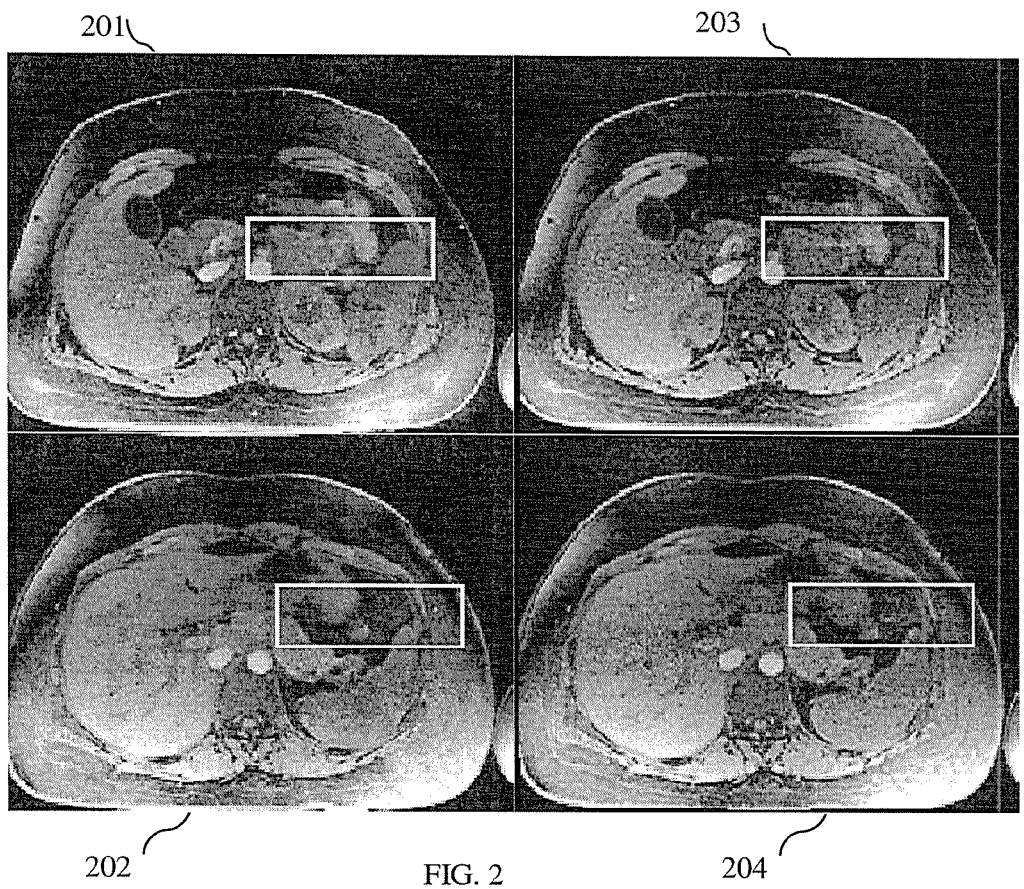
FIG. 2 provides images in accordance with a further aspect of the present invention.

Results of the provided methods are compared with those of a state-of-the-art GRAPPA algorithm. FIG. 2 provides a side by side comparison between GRAPPA and the method which is an aspect of the present invention. The parameters used to obtain these reconstructions were $\alpha_1=20000$, $\alpha_2=800$, $\lambda=0.0025$ and $\epsilon=1e-7$. The maximum number of iterations was 20. For the sake of comparison, some aliasing artifacts in the GRAPPA reconstruction are highlighted. In FIG. 2 images 201 and 202 provide reconstructions using the methods which are aspects of the present invention. Images 203 and 204 are reconstructions using a state-of-the—art GRAPPA method. The white box in all 4 images 201, 202, 203 and 204 highlights the location of aliasing effects in the Grappa reconstruction. It can be noticed that these aliasing effects are suppressed in the reconstructions applying the methods which are aspects of the present invention.

In summary, new methods are provided for the parallel MR reconstruction problem. These methods, in accordance with aspects of the present invention, provide benefits, such as, for instance: 1) Reduced aliasing by providing a robust error measure on the acquired lines in k-space, and 2) Reduced noise by employing an edge-preserving (robust) measure of spatial coherence. Additionally, the provided methods are fast and do not produce the banding artifacts as described in "A. Raj, G. Singh, and R. Zabih., MRF's for MRI's: Bayesian reconstruction of MR images via graph cuts., In Proc. of 2006 IEEE Computer Society Conf. on Computer Vision and Pattern Recognition (CVPRO6), volume 1, pages 1061-1068. IEEE Computer Society, 2006."". Moreover, the herein provided methods can easily be extended to 3D volume reconstructions (as opposed to reconstruction of each slice independently). Lastly, the effectiveness of the methods was demonstrated on different images, and compared to the use of GRAPPA.

System

Figure 3:
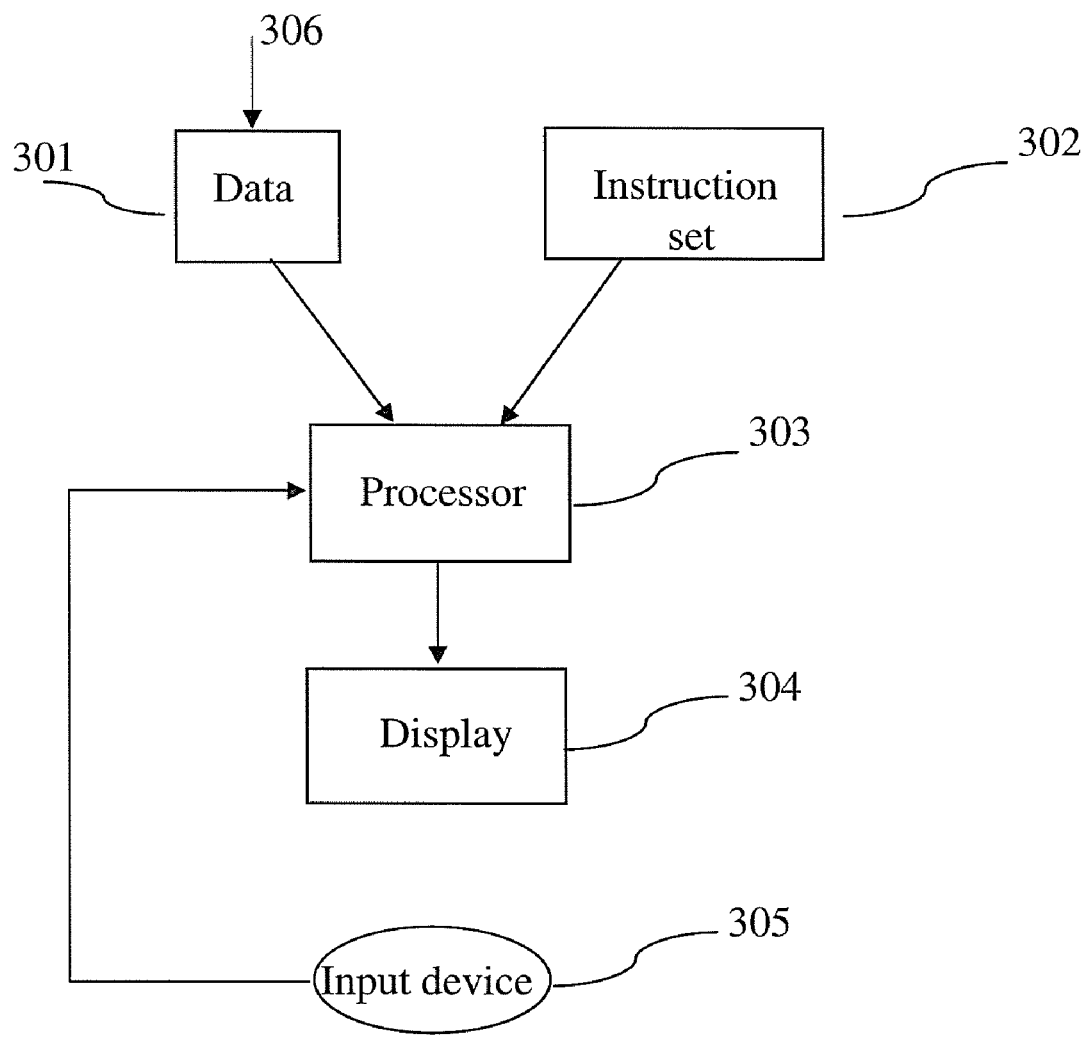
FIG. 3 illustrates a computer system that is used to perform the steps described herein in accordance with another aspect of the present invention.

The parallel Magnetic Resonance Imaging methods that are aspects of the present invention can be executed by a system as shown in FIG. 3. The system is provided with data 301 representing image data. Image data may be provided on an input 306. An instruction set or program 302 executing the methods of the present invention is provided and combined with the data in a processor 303, which can process the instructions of 302 applied to the data 301. An image can be outputted on a device 304. Such a device for instance can be a display. The processor can be dedicated hardware. However, the processor can also be a CPU or any other computing device that can execute the instructions of 302. An input device 305 like a mouse, or track-ball or other input device may be present to allow a user to select an initial object. The input device may also be used to start or stop instructions on the processor. Accordingly, the system as shown in FIG. 3 provides a system for parallel Magnetic Resonance Imaging using methods disclosed herein.

The following references are generally descriptive of the background of the present invention and are hereby incorporated herein by reference: [1] R. Bammer and S. O. Schoenberg., Current concepts and advances in clinical parallel magnetic resonance imaging., Topics in Magnetic Resonance Imaging, 15(3):129-58, June 2004.; [2] G. Golub and C. Van Loan. Matrix Computations., The Johns Hopkins University Press, 3rd edition, 1996.; [3] L. Grady., Random walks for image segmentation., IEEE Transactions on Pattern Analysis and Machine Intelligence, 28(11): 1768-1783, November 2006.; [4] M. A. Griswold, P. M. Jakob, R. M. Heidemann, N. Nittka, V. Jellus, J. M. Wang, B. Kiefer, and A. Haase., Generalized autocalibrating partially parallel acquisitions (GRAPPA). Magnetic Resonance in Medicine, 47:1202-1210, 2002.; [5] W. H. Press, S. A Teukolsky, W. T. Vetterling, and B. P. Flannery. Numerical Recipes in C: The Art of Scientific Computing., Cambridge University Press, 2nd edition, 2002.; [6] K. P. Pruessmann, M. Weiger, M. B. Scheidegger and B. Peter., SENSE: Sensitivity encoding for fast MRI., Magnetic Resonance in Medicine, 42(5): 952-962, 2001.; [7] A. Raj, G. Singh, and R. Zabih. MRF's for MRI's: Bayesian reconstruction of MR images via graph cuts., In Proc. of 2006 IEEE Computer Society Conf. on Computer Vision and Pattern Recognition (CVPRO6), volume 1, pages 1061-1068. IEEE Computer Society, 2006.; and [8] G. Strang. Introduction to Applied Mathematics. Wellesley-Cambridge Press, 1986.

While there have been shown, described and pointed out, fundamental novel features of the invention as applied to preferred embodiments thereof, it will be understood that various omissions and substitutions and changes in the form and details of the methods and system illustrated and in its operation may be made by those skilled in the art without departing from the spirit of the invention. It is the intention, therefore, to be limited only as indicated by the scope of the claims appended hereto.

The invention claimed is:

1. A method for parallel Magnetic Resonance Image (pMRI) reconstruction from image data, comprising:
   a processor processing acquired lines in k-space to reconstruct an image from image data that is obtained in parallel from a plurality of Magnetic Resonance receivers, each Magnetic Resonance receiver acquiring a subset of lines associated with the image; and the processor optimizing a quality measure in the reconstructed image by applying a bounded penalty.

2. The method as claimed in claim 1, wherein the bounded penalty is determined by the processor by applying an error function $$\sigma^\alpha(arg) = \sum_i \left(1 - e^{-\alpha arg_i^2}\right)$$

wherein $\alpha$ is an application dependent parameter and arg is an argument vector which contains elements $arg_i$.

3. The method as claimed in claim 1, further comprising: the processor applying a discontinuity preserving spatial coherency function to image data for reducing noise.

4. The method as claimed in claim 3, wherein the function is expressed as:

$$f(x) = \lambda \sigma^{\alpha_2}(Ax); \text{ wherein}$$

$\alpha_2$ is a gradient level defining a discontinuity;
$\lambda$ denotes a strength of smoothing: x denotes the reconstructed image; and
A denotes a node-edge incidence matrix.

5. The method as claimed in claim 4, further comprising the processor solving $$\min_x f(x) = \min_x \sum_i \sigma^{\alpha_1}(Ky_i - KFS_i x) + \lambda \sigma^{\alpha_2}(Ax);$$

wherein
K is a diagonal matrix reflecting known frequencies;
i relates to a coil i out of N coils;
F is a discrete Fourier transformation matrix;
$S_i$ represents a sensitivity map for coil i;
$\alpha_1$ expresses a point at which an acquired line is defined an outlier;
$\alpha_2$ expresses a gradient level defining a discontinuity;
$\lambda$ controls a smoothing;
$y_i$ is a known component of a coil i in a MRI machine,
x represents the reconstructed image.

6. The method as claimed in claim 1, wherein an error data term due to aliasing is expressed as $$f(x) = \sum_{i=1}^N \sigma^{\alpha_1}(Ky_i - KFS_i x) \text{ with } \sigma^\alpha(arg) = \sum_j \left(1 - e^{-\alpha^* arg_j^2}\right);$$

wherein
K is a diagonal matrix reflecting known frequencies;
i relates to a coil i out of N coils;
F is a discrete Fourier transformation matrix;
$S_i$ represents a sensitivity map for coil i;
$\alpha_1$ express a point at which an acquired line is defined an outlier;
$\alpha_2$ expresses a gradient level defining a discontinuity;
$y_i$ is a known component of a coil i in a MRI machine,
x represents the reconstructed image; and
arg is an argument vector which contains elements $arg_j$.

7. The method as claimed in claim 1, wherein the bounded penalty is applied iteratively by the processor.

8. The method as claimed in claim 1, further comprising:
estimating $C_{1,i}$ by $C^{\alpha_1}(FS_i x_t - y_i)$;
estimating $C_2$ by $C^{\alpha_2}(Ax_t)$;
solving in an iterative way an equation $$\left(\sum_i S_i^T F^T K C_{1,i} F S_i + \lambda A^T C_2 A\right) x_t = \left(\sum_i S_i^T F^T K C_{1,i} y_i\right)$$

for $X_t$,
and
stopping solving when $\|x_t - x_{t-1}\| \geq \epsilon$ or when a maximum number of iterations has been reached, and wherein
$C^\alpha$ (argument) is a diagonal matrix representation with exponential terms representing elements of a vector argument;
F is a discrete Fourier transformation matrix;
$S_i$ represents a sensitivity map for coil i;
A denotes a node-edge incidence matrix;
T denotes a matrix transposition;
$\alpha_1$ expresses a point at which an acquired line is defined an outlier;
$\alpha_2$ expresses a gradient level defining a discontinuity;
K a diagonal matrix reflecting known frequencies;
$\lambda$ controls a smoothing;
$y_i$ is a known component of a coil i in a MRI machine, and
$x_t$ represents the reconstructed image at an iteration t.

9. The method as claimed in claim 8, wherein $\alpha_1 = 20{,}000$, $\alpha_2 = 800$, $\lambda = 0.0025$ and
$\epsilon = 1e-7$.

10. A method for parallel Magnetic Resonance Image (pMRI) reconstruction from image data, comprising:
a processor processing acquired lines in k-space to reconstruct an image from image data that is obtained in parallel from multiple Magnetic Resonance receivers, each Magnetic Resonance receiver acquiring a subset of lines associated with the image; and
the processor adjusting acquired lines in k-space to meet a quality measure of the reconstructed image by applying a bounded penalty.

11. The method as claimed in claim 10, wherein the quality measure is expressed as an error function $$f(x) = \sum_{i=1}^N \sigma^{\alpha_1}(Ky_i - KFS_i x) \text{ with } \sigma^\alpha(arg) = \sum_j \left(1 - e^{-\alpha^* arg_j^2}\right)$$

wherein:
K a diagonal matrix reflecting known frequencies;
i relates to a coil i out of N coils;
F is a discrete Fourier transformation matrix;
$S_i$ represents a sensitivity map for coil i;
$\alpha_1$ expresses a point at which an acquired line is defined an outlier;
$y_i$ is a known component of a coil i in a MRI machine,
x represents the reconstructed image; and
arg is an argument vector which contains elements $arg_j$.

12. The method as claimed in claim 10, further comprising:
using a discontinuity preserving spatial coherency function for reducing noise.

13. The method as claimed in claim 12, wherein the function is expressed as:

$$f(x) = \lambda \sigma^{\alpha_2}(Ax) \text{ with } \sigma^\alpha(arg) = \sum_j \left(1 - e^{-\alpha^* arg_j^2}\right)$$

wherein
$\lambda$ denotes a strength of smoothing;

$\alpha_2$ is a gradient level defining a discontinuity;
x denotes the reconstructed image;
A denotes a node-edge incidence matrix; and
arg is an argument vector which contains elements $arg_j$.

14. The method as claimed in claim 10, further comprising solving $$\min_x f(x) = \min_x \sum_i \sigma^{\alpha_1}(Ky_i - KFS_i x) + \lambda \sigma^{\alpha_2}(Ax)$$

with $$\sigma^\alpha(arg) = \sum_j \left(1 - e^{-a^* arg_j^2}\right)$$

wherein
K is a diagonal matrix reflecting known frequencies;
i relates to a coil i out of N coils;
F is a discrete Fourier transformation matrix;
$S_i$ presents a sensitivity map for coil i;
$\alpha_1$ expresses a point at which an acquired line is defined an outlier;
$\alpha_2$ expresses a gradient level defining a discontinuity;
$\lambda$ controls a smoothing;
$y_i$ is a known component of a coil i in a MRI machine,
x represents the reconstructed image; and
arg is an argument vector which contains elements $arg_j$.

15. The method as claimed in claim 10, wherein the bounded penalty is applied iteratively.

16. A system for parallel Magnetic Resonance Image (pMRI) reconstruction from image data, comprising:
a processor;
software operable on the processor to:
processing acquired lines in k-space to reconstruct an image from image data that is obtained in parallel from multiple Magnetic Resonance receivers, each Magnetic Resonance receiver acquiring a subset of lines associated with the image; and
optimizing a quality measure in the reconstructed image by applying a bounded penalty.

17. The system as claimed in claim 16, wherein the bounded penalty is applied iteratively.

18. The system as claimed in claim 16, wherein the bounded penalty is determined by an error function $$\sigma^\alpha(x) = \sum_i \left(1 - e^{-\alpha x_i^2}\right)$$

wherein $\alpha$ is an application dependent parameter and x is an argument vector which contains elements $x_i$.

19. The system as claimed in claim 16, further comprising:
using a discontinuity preserving spatial coherency function for reducing noise.

20. The system as claimed in claim 19, wherein the function is expressed as:

$$f(x) = \lambda \sigma^{\alpha_2}(Ax); \text{ wherein}$$

$\alpha_2$ gradient level defining a discontinuity;
$\lambda$ denotes a strength of smoothing; x denotes the reconstructed image; and
A denotes a node-edge incidence matrix.

21. The system as claimed in claim 16, wherein an error data term due to aliasing is expressed as $$f(x) = \sum_{i=1}^N \sigma^{\alpha_1}(Ky_i - KFS_i x) \text{ with } \sigma^\alpha(arg) = \sum_j \left(1 - e^{-a^* arg_j^2}\right);$$

wherein
K is a diagonal matrix reflecting known frequencies;
i relates to a coil i out of N coils;
F is a discrete Fourier transformation matrix;
$S_i$ represents a sensitivity map for coil i;
$\alpha_1$ expresses a point at which an acquired line is defined an outlier;
$\alpha_2$ expresses a gradient level defining a discontinuity;
$y_i$ is a known component of a coil i in a MRI machine,
x represents the reconstructed image; and
arg is an argument vector which contains elements $arg_j$.

22. The system as claimed in claim 16, further comprising solving $$\min_x f(x) = \min_x \sum_i \sigma^{\alpha_1}(Ky_i - KFS_i x) + \lambda \sigma^{\alpha_2}(Ax)$$

$$\min_x f(x) = \min_x \sum_i \sigma^{\alpha_1}(Ky_i - KFS_i x) + \lambda \sigma^{\alpha_2}(Ax);$$

wherein
K is a diagonal matrix reflecting known frequencies;
i relates to a coil i out of N coils;
F is a discrete Fourier transformation matrix;
$S_i$ represents a sensitivity map for coil i;
$\alpha_1$ expresses a point at which an acquired line is defined an outlier;
$\alpha_2$ expresses a gradient level defining a discontinuity;
$\lambda$ controls a smoothing;
$y_i$ is a known component of a coil i in a MRI machine,
x represents the reconstructed image.

\* \* \* \* \*